US 6,610,609 B2

(12) United States Patent
Rutter, Jr. et al.

(10) Patent No.: US 6,610,609 B2
(45) Date of Patent: Aug. 26, 2003

(54) COMPATIBILIZATION TREATMENT

(75) Inventors: Edward W. Rutter, Jr., Franklin, MA (US); Leo L. Linehan, Grafton, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/847,741

(22) Filed: May 2, 2001

(65) Prior Publication Data

US 2001/0036748 A1 Nov. 1, 2001

Related U.S. Application Data

(60) Provisional application No. 60/201,135, filed on May 2, 2000.

(51) Int. Cl.$^7$ .................... H01L 21/302; H01L 21/461; H01L 21/31; H01L 21/469

(52) U.S. Cl. ....................... 438/745; 438/778; 438/788; 257/760

(58) Field of Search ................................. 438/745, 778, 438/788; 257/760

(56) References Cited

U.S. PATENT DOCUMENTS 4,910,122 A * 3/1990 Arnold et al. .............. 430/313
5,605,867 A * 2/1997 Sato et al. .................. 437/235

* cited by examiner

*Primary Examiner*—Alexander Ghyka
(74) *Attorney, Agent, or Firm*—S. Matthew Cairns

(57) ABSTRACT

Disclosed are compositions and methods for improving compatibility of imaging layers with dielectric layers. Also disclosed are methods of reducing or eliminating poisoning of photoresists during electronic device manufacture.

20 Claims, No Drawings

COMPATIBILIZATION TREATMENT

This application claims the benefit of Provisional application No. 60/201,135, filed May 2, 2000.

BACKGROUND OF THE INVENTION

The present invention relates generally to the field of manufacture of electronic devices. In particular, the present invention relates to photoresists and antireflective coatings used in the manufacture of electronic devices.

In the manufacture of electronic devices, such as printed wiring boards or semiconductors, a number of layers of material, such as photoresists or antireflective coatings, are applied to a substrate. Photoresists are photosensitive films used for transfer of an image to a substrate. A coating layer of a photoresist is formed on a substrate and the photoresist layer is then exposed through a photomask (reticle) to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or cross-link in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are known to the art and described by Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4, both incorporated herein by reference to the extent they teach photoresist compositions and methods of making and using them.

A major use of photoresists is in the manufacture of semiconductors where an object is to create features, such as vias, trenches or combinations thereof, in a dielectric layer. Proper photoresist processing is a key to attaining this object. While there is a strong interdependency among the various photoresist processing steps, exposure is believed to be one of the more important steps in attaining high resolution photoresist images.

In such processes, reflection of actinic radiation during exposure of the photoresist and "poisoning" of the photoresist by the dielectric layer are detrimental to fine feature formation. Reflection of actinic radiation, such as from the layer underlying the photoresist, often poses limits on resolution of the image patterned in the photoresist layer. Reflection of radiation from the substrate/photoresist interface can produce variations in the radiation intensity in the photoresist during exposure, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity.

Reflection of activating radiation also contributes to what is known in the art as the "standing wave effect". To eliminate the effects of chromatic aberration in exposure equipment lenses, monochromatic or quasi-monochromatic radiation is commonly used in photoresist projection techniques. Due to radiation reflection at the photoresist/substrate interface, however, constructive and destructive interference is particularly significant when monochromatic or quasi-monochromatic radiation is used for photoresist exposure. In such cases the reflected light interferes with the incident light to form standing waves within the photoresist. In the case of highly reflective substrate regions, the problem is exacerbated since large amplitude standing waves create thin layers of underexposed photoresist at the wave minima. The underexposed layers can prevent complete photoresist development causing edge acuity problems in the photoresist profile. The time required to expose the photoresist is generally an increasing function of photoresist thickness because of the increased total amount of radiation required to expose an increased amount of photoresist. However, because of the standing wave effect, the time of exposure also includes a harmonic component which varies between successive maximum and minimum values with the photoresist thickness. If the photoresist thickness is non-uniform, the problem becomes more severe, resulting in variable linewidths.

With recent trends towards high-density semiconductor devices, there is a movement in the industry to shorten the wavelength of exposure sources to deep ultraviolet (DUV) light (300 nm or less in wavelength), KrF excimer laser light (248 nm), ArF excimer laser light (193 nm), electron beams and soft x-rays. The use of shortened wavelengths of light for imaging a photoresist coating has generally resulted in increased reflection from the upper resist surface as well as the surface of the underlying substrate. Thus, the use of the shorter wavelengths has exacerbated the problems of reflection from a substrate surface.

An approach used to reduce the problem of reflected radiation has been the use of a radiation absorbing layer either interposed between the substrate surface and the photoresist coating layer, called a bottom antireflective coating or BARC, or a radiation layer disposed on the surface of the photoresist layer, called a top antireflective coating or TARC. See, for example, PCT Application WO 90/03598, EPO Application No. 0 639 941 A1 and U.S. Pat. Nos. 4,910,122, 4,370,405 and 4,362,809, all incorporated herein by reference to the extent they teach antireflective (antihalation) compositions and the use of the same. Such BARC and TARC layers have also been generally referred to in the literature as antireflective layers or antireflective compositions. Typically, such antireflective compositions include a radiation absorbing component, or chromophore, a polymeric binder and one or more cross-linking agents.

Variations in substrate topography also give rise to resolution-limiting reflection problems. Any image on a substrate can cause impinging radiation to scatter or reflect in various uncontrolled directions, affecting the uniformity of photoresist development. As substrate topography becomes more complex with efforts to design more complex circuits, the effects of reflected radiation become more critical. For example, metal interconnects used on many microelectronic substrates are particularly problematic due to their topography and regions of high reflectivity.

One method of solving such problems resulting from variations in substrate topography is by placing a photoresist at the same height over a surface, as disclosed in U.S. Pat. No. 4,557,797 (Fuller et al.). This patent uses a multi-layer structure having a relatively thick bottom layer of poly (methyl methacrylate) ("PMMA") to provide a planar surface, a thin middle layer of an antireflective coating and a thin top layer of a photoresist material. However, this system results in a thick polymer layer which must subsequently be removed. Such layers are typically removed by a variety of methods, such as chemical mechanical polishing ("CMP"), etching and wet chemical methods. Due to the added time and cost of such removal processes, it is desired that the polymer layers be as thin as possible to aid in their subsequent removal.

Another approach to solving the problems associated with variations in substrate topography is that disclosed in Adams et al., *Planarizing AR for DUV Lithography, Microlithography* 1999: *Advances in Resist Technology and Processing XVI*, Proceedings of SPIE, vol. 3678, part 2, pp 849–856, 1999, which discloses the use of a planarizing antireflective coating, which reduces the need for a separate planarizing layer disposed between the antireflective layer and the substrate.

The use of photoresist layers on dielectric layers often results in "poisoning" of the imaging layer, even when bottom antireflective coatings are used. This is particularly problematic when the dielectric layer is applied by physical or chemical vapor deposition ("P/CVD") techniques. While the theory of such poisoning is not fully understood, such dielectric layers may cause a significant photospeed shift, lifting, profile degradation or complete dissolution inhibition in previously patterned aperture regions, such as via regions during trench delineation in dual damascene processes. Such poisoning is particularly problematic when positive acting photoresists are used, such as in deep ultraviolet ("DUV") photoresists. While BARCs provide an effective chemical barrier for photoresist layers, such BARCs have not been completely effective in providing a barrier layer against such poisoning by dielectric layers.

There is thus a need to reduce or eliminate the poisoning effect of photoresists by dielectric layers.

SUMMARY OF THE INVENTION

It has been surprisingly found that the compositions and methods of the present invention are effective in reducing or eliminating the photoresist poisoning effects of dielectric layers.

In one aspect, the present invention provides a method of improving compatibility of imaging layers with dielectric layers including the step of contacting the surface of the dielectric layer disposed on a substrate with a composition including one or more acidic components and one or more carriers.

In a second aspect, the present invention provides a substrate having a vapor deposited dielectric layer disposed thereon, wherein the dielectric layer is substantially compatible with an imaging layer.

In a third aspect, the present invention provides a substrate having a dielectric layer disposed thereon, wherein the dielectric layer is contacted with a composition including one or more acidic components and one or more carriers.

In a fourth aspect, the present invention provides a method for manufacturing an electronic device including the steps of: a) providing a dielectric layer on a substrate; b) contacting the dielectric layer with a composition including one or more acidic components and one or more carriers; and c) disposing on the surface of the dielectric layer an imaging layer.

DETAILED DESCRIPTION OF THE INVENTION

As used throughout this specification, the following abbreviations shall have the following meanings, unless the context clearly indicates otherwise: ° C.=degrees Centigrade; g=gram; cm=centimeter; Å=angstroms; rpm=revolutions per minute; wt %=percent by weight; DI=deionized; L=liter and mL=milliliter. The term "polymer" refers to dimers, trimers, tetramers, oligomers, homopolymers, copolymers and the like. The term "(meth) acrylic" includes both acrylic and methacrylic and the term "(meth)acrylate" includes both acrylate and methacrylate. Likewise, the term "(meth)acrylamide" refers to both acrylamide and methacrylamide. "Alkyl" includes straight chain, branched and cyclic alkyl groups. "Apertures" refer to vias, trenches, and combinations thereof. The term "halogen" refers to fluorine, chlorine, bromine and iodine. Likewise, the term "halo" refers to fluoro, chloro, bromo and iodo.

All amounts are percent by weight and all ratios are by weight, unless otherwise noted. All numerical ranges are inclusive and combinable.

The present invention is directed to providing a substrate having a dielectric layer, particularly a vapor deposited dielectric layer, that is substantially compatible with a subsequently applied imaging layer. By "substantially compatible" is meant that the dielectric layer does not substantially effect the lithographic characteristics of the imaging layer disposed thereon, i.e. that little or no poisoning effect occurs. The present invention is further directed to reducing or eliminating the poisoning of an imaging layer by a dielectric layer. The term "poisoning" refers to any adverse effects a dielectric layer has on an imaging layer disposed thereon. Such "poisoning" includes, but is not limited to, significant photospeed shifts, lifting, profile degradation or complete dissolution inhibition in previously patterned aperture regions, such as via regions during trench delineation in dual damascene processes. The present invention is particularly suited for use in any electronic device manufacturing process where an imaging layer is applied to a dielectric layer substrate.

In the manufacture of electronic devices, particularly semiconductor wafers, dielectric layers are often applied. These dielectric layers need to be patterned for subsequent etching and metallization steps. Such patterning is achieved through the use of imaging layers. As used herein, "imaging layer" refers to any layer capable of being imaged, such as photoresist layers, as well as any multilayer structures capable of being imaged. Such multilayer structures include, but are not limited to, a photoresist layer and an antireflective coating which may be a bottom or a top antireflective coating. Particularly suitable imaging layers include a bottom antireflective coating and a photoresist layer. By using the compositions of the present invention to treat the dielectric layer, poisoning of the imaging layer is greatly reduced or eliminated.

The present invention is particularly suited for use with vapor deposited dielectric layers, such as, but not limited to, physical vapor deposition ("PVD"), chemical vapor deposition ("CVD"), plasma enhanced CVD, and the like. Preferred dielectric layers include, but are not limited to, silicon-oxide films such as those containing silicon oxy carbide, silicon oxy nitride, silicon dioxide, and the like. It will be appreciated by those skilled in the art that the compositions of the dielectric films may vary within the film and from film to film, depending upon the deposition conditions and the materials employed. For example, silicon-oxide films may contain an amount of other elements, such as nitrogen, carbon, halogens such as fluorine, and the like.

Dielectric layers are substantially compatibilized with imaging layers according to the present invention by contacting the dielectric layer with a composition including one or more acidic components and one or more carriers. The acidic components are any that are compatible with the carrier used and function to substantially compatibilize the surface of the dielectric layer with subsequent imaging layers. In general, the acidic components are any which are non-oxidizing. Suitable acidic components include, but are not limited to, organic acids such as carboxylic acids and sulfonic acids, phosphonic acid, phosphoric acid, fluoroboric acid, and the like.

The organic acids may be monoacids or polyacids such as diacids, triacids, and the like. Suitable polyacids include, but are not limited to, polyphosphonic acid. It will be appreciated by those skilled in the art that the acids may also be polymeric. Suitable organic acids include, but are not limited to, one or more of alkyl carboxylic acids, alkyl sulfonic acids, aryl carboxylic acids, aryl sulfonic acids, heteroaryl carboxylic acids, heteroaryl sulfonic acids, and the like. The term "aryl" refers to any aromatic ring system generally having about 25 carbons or less such as phenyl, substituted phenyl, biphenyl, substituted biphenyl, naphthyl and substituted naphthyl. The term "heteroaryl" refers to any aromatic ring system generally having about 25 carbons or less and at least one heteroatom such as oxygen, sulfur or nitrogen. The alkyl, aryl or heteroaryl groups may be unsubstituted or substituted. By "substituted alkyl" is meant any alkyl having one or more of its hydrogens replaced by another substituent group, such as halo, hydroxy, cyano, mercapto, and the like. "Substituted aryl" or "substituted heteroaryl" refer to any aryl or heteroaryl group, respectively, having one or more of its hydrogens replaced by another substituent group, such as halo, hydroxy, cyano, mercapto, and the like. Particularly suitable substituted alkyl carboxylic acids and substituted alkyl sulfonic acids are haloalkyl carboxylic acids and haloalkyl sulfonic acids. It is preferred that the haloalkyl carboxylic acids are fluoroalkyl carboxylic acids. It is also preferred that the haloalkyl sulfonic acids are fluoroalkyl sulfonic acids.

Particularly suitable organic acids include, but are not limited to, one or more of polycarboxylic acids such as poly(meth)acrylic acid; $(C_1-C_{30})$alkyl carboxylic acids; $(C_1-C_{30})$haloalkyl carboxylic acids such as trifluoroacetic acid; $(C_1-C_{30})$alkyl sulfonic acids such as methane sulfonic acid, ethane sulfonic acid and propane sulfonic acid; $(C_1-C_{30})$haloalkyl sulfonic acids such as perfluorooctane sulfonic acid, trifluoromethyl sulfonic acid, perfluorobutane sulfonic acid and perfluorohexane sulfonic acid; $(C_6-C_{25})$ aryl carboxylic acids; $(C_6-C_{25})$heteroaryl carboxylic acids, $(C_6-C_{25})$aryl sulfonic acids such as para-toluene sulfonic acid, phenyl sulfonic acid and dodecylbenzene sulfonic acid; and $(C_6-C_{25})$heteroaryl sulfonic acids. It will be appreciated by those skilled in the art that polymeric acids include copolymers having as polymerized units at least one acid containing monomer. Thus, copolymers containing acrylic acid, methacrylic acid or mixtures thereof as polymerized units are particularly suitable. The polymeric acids useful in the present invention may optionally be cross-linked.

The acidic components useful in the present invention are generally commercially available and may be used without further purification. Typically, the acidic components are present in the compositions of the present invention in an amount of from about 1 to about 99 wt %, preferably from about 5 to about 95 wt %, and more preferably from about 10 to about 90 wt %.

Carriers useful in the present invention are any which dissolve, suspend, disperse, or otherwise provide the acidic component to the surface of the substrate layer to be treated. Suitable carriers include water, organic solvents, polymeric carriers and mixtures thereof. The organic solvents useful in the present invention include, but are not limited to, 2-heptanone, ethyl lactate or one or more of the glycol ethers such as 2-methoxyethyl ether (diglyme), ethylene glycol monomethyl ether, diethylene glycol monomethyl ether, diethylene glycol dimethyl ether, propylene glycol monomethyl ether and dipropylene glycol monomethyl ether; solvents that have both ether and hydroxy moieties such as methoxy butanol, ethoxy butanol, methoxy propanol and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyrolactone. It will be appreciated by those skilled in the art that mixtures of solvents may be advantageously used in the present invention.

Suitable polymeric carriers include, but are not limited to, one or more of aromatic-aldehyde condensates, poly(vinyl phenol), poly(meth)acrylates such as poly(alkyl (meth) acrylates), poly(meth)acrylic acids, poly(meth)acrylamides, and the like. Mixtures of polymeric carriers may be employed in the present invention. The aromatic-aldehyde condensates useful in the present invention include, but are not limited to, phenolic novolak resins. Such novolak resins are typically prepared by condensation of a phenol with an aldehyde and are well known in the art and described in numerous publications including the Kirk Othmer Encyclopedia of Chemical Technology, Volume 15, pages 176 to 208, 1968, incorporated herein by reference to the extent it teaches such resins. Although phenol itself is the commonly used phenol for the formation of such phenolic resins, other hydroxy-substituted aromatic compounds are equally suitable, such as but not limited to resorcinol, gallic acid, alkyl substituted phenols such as naphthols, cresols, xylenols, and p-tert-butylphenol, and bisphenols such as p-phenylphenol and 4,4'-isopropylidenediphenol. Preferred phenols include the cresols, and more preferably m-cresol, mixtures of m- and p-cresol, 2,5-xylenol and mixtures thereof. Mixtures of hydroxy-substituted aromatic compounds may be advantageously used in the present invention.

Typically, the poly(alkyl (meth)acrylates) useful as carriers in the present invention are polymers including as polymerized units one or more $(C_1-C_{24})$ alkyl (meth) acrylate monomers. Suitable alkyl (meth)acrylate monomers include, but are not limited to, "low cut" alkyl (meth) acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl-(meth)acrylates are typically those where the alkyl group contains from 7 to 15 carbon atoms. Suitable mid cut alkyl (meth)acrylates include, but are not limited to: 2-ethylhexyl acrylate ("EHA"), 2-ethylhexyl methacrylate, octyl methacrylate, decyl methacrylate, isodecyl methacrylate ("IDMA", based on branched (CiO)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA").

"High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl (meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the present invention may be a single monomer or a mixture having different numbers of carbon atoms in the alkyl portion. Also, the (meth)acrylamide and alkyl (meth)acrylate monomers useful in the present invention may optionally be substituted. Suitable optionally substituted (meth)acrylamide and alkyl (meth)acrylate monomers include, but are not limited to: hydroxy ($C_2$–$C_6$)alkyl (meth)acrylates, dialkylamino ($C_2$–$C_6$)-alkyl (meth)acrylates, dialkylamino($C_2$–$C_6$)alkyl (meth)acrylamides.

Particularly useful substituted alkyl (meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a ($C_2$–$C_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. The preferred hydroxyalkyl (meth)acrylate monomers are HEMA, 1-methyl-2-hydroxyethyl methacrylate, 2-hydroxypropyl methacrylate and mixtures thereof. A mixture of the latter two monomers is commonly referred to as "hydroxypropyl methacrylate" or "HPMA."

The poly(meth)acrylamide polymers useful as carrier in the present invention include as polymerized units at least one of acrylamide or methacrylamide monomers. It will be appreciated that acrylamide and methacrylamide may be used in combination.

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl) acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention include one or more of silicon-containing monomers such as, but not limited to, γ-propyl tri($C_1$–$C_6$) alkylsilyl (meth)acrylate, vinyl tri($C_1$–$C_6$)alkylsilyl (meth)acrylate, and the like.

When polymeric carriers are used in the present invention, it is preferred that the polymeric carriers have weight average molecular weights of about 8000 or less, more preferably about 5000 or less and even more preferably about 3000 or less. It is also preferred that polymeric carriers have a weight average molecular weight of at least about 300, preferably at least about 400, and more preferably at least about 500. Thus, a particularly useful weight average molecular weight range is from about 300 to about 8000, and more particularly from about 400 to about 5000.

The carriers useful in the present invention are generally commercially available and may be used without further purification. Typically, the carrier is present in the compositions of the present invention in an amount of from about 99 to about 1 wt %, preferably from about 95 to about 5 wt %, and more preferably from about 90 to about 10 wt %.

The compositions useful in the present may be prepared by combining the one or more acidic components and the one or more carriers. The compositions of the present invention may be solutions, dispersions or slurries. It is preferred that the compositions are solutions.

The compositions of the present invention may optionally include one or more other components, such as, but not limited to, plasticizers, surfactants, leveling agents, dyes, pigments, and the like.

Plasticizers may be added to the compositions of the present invention to improve certain characteristics of the compositions. Suitable plasticizers include, but are not limited to, dibasic esters such as dimethyl adipate and dimethyl succinate. Mixtures of plasticizers may be used in the present invention. Such plasticizers may be used when a polymeric acidic component film or layer is desired. It is preferred that the plasticizer is a liquid. The choice and amount of such plasticizer is within the ability of one skilled in the art.

The leveling agents useful in the present invention are surface leveling agents such as those available under the tradename Silwet 7604 from Union Carbide, or the surfactant FC 430 available from the 3M Company. The choice and amount of such leveling agent is within the ability of one skilled in the art.

Methods of improving the compatibility of imaging layers with dielectric layers including the step of contacting the surface of the dielectric layer disposed on a substrate with a composition including one or more acidic components and one or more carriers are provided according to the present invention. Typically, the dielectric layers may be contacted with the compositions of the present invention by any conventional means, such as by dipping, spraying, spin coating and the like.

The dielectric layers are contacted with the compositions of the present invention for a period of time sufficient to compatibilize the dielectric layer with subsequently applied imaging layers. After such treatment, substrates having a vapor deposited dielectric layer disposed thereon, wherein the dielectric layer is substantially compatible with an imaging layer, are obtained. Typically, the compositions of the present invention contact the dielectric layers for a period of time from about 1 to about 320 seconds, preferably from about 15 to about 240 seconds, and more preferably from about 30 to about 180 seconds. The dielectric layer is then rinsed, such as with DI water, developer, or other suitable remover such as organic solvent, and dried prior to the application of subsequent imaging layers. Any suitable developer may be used, such as tetramethylammonium hydroxide.

In the alternative, when a polymeric acidic component is used, such as polymers containing as polymerized units (meth)acrylic, and particularly polyacrylic acid, a film or layer of the acidic component may be deposited on the surface of the dielectric layer. Such film may be deposited by taking up the polymeric acidic component in a suitable carrier to form a treatment composition, dispensing the treatment composition on the surface of the dielectric layer disposed on a substrate and heating the substrate to substantially remove the carrier. The thickness of such films is not critical, but are typically in the range of from 50 to 1500 Å. It is preferred that such polymeric acidic components are spun-on the substrate layer to be treated. Any conventional spin-on procedure may be used. Typically, the substrate is rotated at a speed of from about 20 to about 3500 rpm. Such acidic component films may be removed by contact with water or other suitable remover, such as organic solvent.

Acidic component films according to the present invention are also obtained by disposing a composition containing an acidic component and a polymeric carrier on the surface of a substrate. Such films may be deposited as described above and have. thicknesses in the range described above. It may be advantageous in some instances to use a polymeric acidic component and a polymeric carrier.

During application of the compositions of the present invention to the dielectric layer or after such application but prior to any subsequent rinsing steps, the substrate containing the dielectric layer may optionally be, and preferably is, heated. Typically, the substrate containing the dielectric layer is heated while the compositions of the present invention are contacted with the dielectric layer. Alternatively, the treating compositions may be heated and then contacted with the dielectric layer, or both the substrate and the treating compositions may be heated. Such heating is typically from about 75° to about 250° C., and preferably from about 90° to about 225° C. In general, such heating is for a period of time sufficient to compatibilize the dielectric layer with subsequent imaging layers, typically from about 1 to about 320 seconds, and preferably from about 15 to about 240 seconds.

It is preferred that the compositions of the present invention are disposed on the substrate and the substrate heated prior to any subsequent rinse or removal step. A rinsing or removal step may then be performed after such heating step.

The term "removal" include both dissolution with a solvent or water as well as stripping of the film with a developer, such as those containing tetraalkylammonium hydroxide or other similar stripping agent.

The present invention provides a method for manufacturing an electronic device including the steps of: a) providing a dielectric layer on a substrate; b) contacting the dielectric layer with a composition including one or more acidic components and one or more carriers; and c) disposing on the surface of the dielectric layer an imaging layer. It is preferred that the imaging layer is a photoresist layer. It is further preferred that an antireflective coating is disposed between the dielectric layer and the photoresist layer.

The compositions and methods of the present invention are useful in treating various layers to be imaged on a substrate, such as dielectric layers, in the manufacture of electronic devices, such as semiconductors, conductors, integrated circuits, printed wiring boards, and the like. The compositions of the present invention are particularly useful in the manufacture of semiconductor devices such as wafers used in the manufacture of semiconductors. It is preferred that the compositions of the present invention are substantially free of cross-linking agent. It is further preferred that the compositions of the present invention remain substantially uncross-linked after any heating step. By "substantially uncross-linked" is meant that the compositions of the present invention remain soluble or removable in a suitable rinsing agent, such as water, organic solvents or developers, particularly tetraalkylammonium hydroxide based developers.

It will be appreciated by those skilled in the art that the compositions and methods of the present invention are used to treat a dielectric layer prior to the application of any imaging layer. It is also advantageous to further treat such dielectric layers after apertures have been formed in such layers. The present invention is particularly suitable for treating dielectric layers after the formation of any apertures in such layers and prior to the application of any subsequent imaging layers.

Thus, the present invention provides a method for manufacturing an electronic device including the steps of: a) providing a dielectric layer on a substrate; b) contacting the dielectric layer with a composition including one or more acidic components and one or more carriers; c) heating the substrate; d) disposing on the surface of the dielectric layer an antireflective coating; e) disposing on the surface of the antireflective coating a photoresist layer; and f) imaging the photoresist layer. Following imaging or exposure, the photoresist layer is then developed, and the dielectric layer is etched and metallized. The above steps may then repeated until the desired structure of the electronic device is obtained.

Although the invention has been described with respect to semiconductor manufacture, it will be appreciated that the present invention may be used in a wide variety of applications.

What is claimed is:

1. A method of reducing the poisoning of an imaging layer by a dielectric layer comprising the steps of contacting the surface of a dielectric layer disposed on a substrate with a composition comprising one or more acidic components and one or more carriers; removing the composition from the dielectric layer prior to disposing an imaging layer on the dielectric layer; and disposing the imaging layer on the dielectric layer.

2. A method for manufacturing an electronic device comprising the steps of:

a) providing a dielectric layer on a substrate;

b) contacting the dielectric layer with a composition comprising one or more acidic components and one or more carriers;

c) removing the composition from the dielectric layer; and d) disposing an imaging layer on the surface of the dielectric layer.

3. The method of claim 2 wherein the one or more acidic components comprise organic acids, phosphonic acid, phosphoric acid, fluoroboric acid or mixtures thereof.

4. The method of claim 3 wherein the organic acids are monoacids or polyacids.

5. The method of claim 3 wherein the organic acids are alkyl carboxylic acids, alkyl sulfonic acids, aryl carboxylic acids, aryl sulfonic acids, heteroaryl carboxylic acids, heteroaryl sulfonic acids, or mixtures thereof.

6. The method of claim 5 wherein the organic acids comprise one or more of poly(meth)acrylic acid, $(C_1-C_{30})$ alkyl carboxylic acids; $(C_1-C_{30})$haloalkyl carboxylic; $(C_1-C_{30})$alkyl sulfonic acids; $(C_1-C_{30})$haloalkyl sulfonic acids; $(C_6-C_{25})$aryl carboxylic acids, $(C_6-C_{25})$heteroaryl carboxylic acids; $(C_6-C_{25})$aryl sulfonic acids; or $(C_6-C_{25})$ heteroaryl sulfonic acids.

7. The method of claim 6 wherein the organic acids comprise one or more of trifluoroacetic acid, methane sulfonic acid, ethane sulfonic acid, propane sulfonic acid, perfluorooctane sulfonic acid, trifluoromethyl sulfonic acid, perfluorobutane sulfonic acid, perfluorohexane sulfonic acid, para-toluene sulfonic acid, phenyl sulfonic acid, and dodecylbenzene sulfonic acid.

8. The method of claim 2 wherein the carrier comprises water, organic solvents, polymeric carriers or mixtures thereof.

9. The method of claim 1 wherein the carrier comprises one or more of aromatic-aldehyde condensates, poly(vinyl phenol), poly(meth)acrylates such as poly(alkyl (meth) acrylates), poly(meth)acrylic acids, or poly(meth) acrylamides.

10. The method of claim 1 wherein the dielectric layer is vapor deposited on the substrate.

11. The method of claim 10 wherein the dielectric layer is deposited by physical vapor deposition, chemical vapor deposition or plasma enhanced chemical vapor deposition.

12. An electronic device comprising a substrate having a dielectric layer disposed thereon and an imaging layer disposed on the dielectric layer, wherein the dielectric layer is contacted with a composition comprising one or more acidic components and one or more carriers and the composition removed from the dielectric layer prior to the imaging layer being disposed on the dielectric layer.

13. The method of claim 2 wherein the imaging layer comprises a photoresist layer and a bottom antireflective coating.

14. The method of claim 2 wherein the imaging layer comprises a photoresist.

15. The method of claim 2 wherein the dielectric layer is vapor deposited on the substrate.

16. The method of claim 15 wherein the dielectric layer is deposited by physical vapor deposition, chemical vapor deposition or plasma enhanced chemical vapor deposition.

17. The method of claim 1 further comprising the step of heating prior to the step of removing the composition.

18. The electronic device of claim 12 wherein the dielectric layer is vapor deposited on the substrate.

19. The electronic device of claim 12 wherein the devise is heated prior to the removal of the composition from the dielectric layer.

20. The method of claim 2 further comprising the step of heating prior to the step of removing the composition.

* * * * *